US010861858B2

(12) United States Patent
Lee et al.

(10) Patent No.: US 10,861,858 B2
(45) Date of Patent: Dec. 8, 2020

(54) STATIC RANDOM-ACCESS MEMORY WITH CAPACITOR WHICH HAS FINGER-SHAPED PROTRUDENT PORTIONS AND RELATED FABRICATION METHOD

(71) Applicant: Powerchip Technology Corporation, Hsinchu (TW)

(72) Inventors: Shih-Ping Lee, Hsinchu (TW); Yu-Cheng Lu, Miaoli County (TW); Kuo-Fang Huang, Hsinchu (TW); Chia-Hsien Kuo, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/395,215

(22) Filed: Apr. 25, 2019

(65) Prior Publication Data
US 2020/0219891 A1 Jul. 9, 2020

(30) Foreign Application Priority Data

Jan. 4, 2019 (TW) .............................. 108100321 A

(51) Int. Cl.
*H01L 27/11* (2006.01)
*G11C 11/412* (2006.01)
(Continued)

(52) U.S. Cl.
CPC ........ *H01L 27/1104* (2013.01); *G11C 11/412* (2013.01); *G11C 11/4125* (2013.01);
(Continued)

(58) Field of Classification Search
CPC . H01L 27/1104; H01L 28/60; H01L 21/7688; H01L 21/31056; H01L 27/0928; G11C 11/412
See application file for complete search history.

(56) References Cited

U.S. PATENT DOCUMENTS 5,541,427 A * 7/1996 Chappell ............. G11C 11/4125
257/306
5,811,332 A * 9/1998 Chao ................. H01L 27/10817
148/DIG. 14
(Continued)

FOREIGN PATENT DOCUMENTS

TW 201442080 A 11/2014

*Primary Examiner* — Mushfique Siddique
(74) *Attorney, Agent, or Firm* — Winston Hsu

(57) ABSTRACT

A static random-access memory structure includes a substrate, a first conductive type transistor, a second conductive type transistor and a capacitor unit. The first conductive type transistor and the second conductive type transistor are disposed on the surface of the substrate, and the capacitor unit is positioned between the transistors. The capacitor unit includes a first electrode, a second electrode, and a dielectric layer disposed between the first electrode and the second electrode. The first electrode includes a plurality of first protrudent portions and a planar portion. The first protrudent portions are connected to the first planar portion and protrude from the top surface of the planar portion. The second electrode covers the top surface of the first protrudent portions and formed between adjacent first protrudent portions.

17 Claims, 16 Drawing Sheets

(51) Int. Cl.
*H01L 27/092* (2006.01)
*H01L 49/02* (2006.01)
*H01L 21/768* (2006.01)
*H01L 21/3105* (2006.01)

(52) U.S. Cl.
CPC .... *H01L 21/31056* (2013.01); *H01L 21/7688* (2013.01); *H01L 27/0928* (2013.01); *H01L 28/60* (2013.01)

(56) References Cited

U.S. PATENT DOCUMENTS

| | | | |
|---|---|---|---|
| 5,886,375 A * | 3/1999 | Sun | H01L 27/1108 257/296 |
| 5,904,522 A * | 5/1999 | Chao | H01L 27/10852 257/E21.648 |
| 7,067,864 B2 * | 6/2006 | Nishida | H01L 27/11 257/296 |
| 8,890,227 B1 | 11/2014 | Chen | |
| 9,991,333 B1 * | 6/2018 | Liu | H01L 28/87 |
| 10,020,311 B1 | 7/2018 | Li | |
| 2005/0098905 A1 * | 5/2005 | Lee | H01L 27/1087 257/296 |
| 2007/0215937 A1 | 9/2007 | Huang | |
| 2007/0287247 A1 * | 12/2007 | Liu | H01L 28/60 438/238 |
| 2008/0025092 A1 * | 1/2008 | Liaw | H01L 27/1104 365/185.08 |
| 2009/0140344 A1 * | 6/2009 | Azuma | H01L 27/1104 257/368 |
| 2013/0056882 A1 * | 3/2013 | Kim | H01L 23/16 257/777 |
| 2017/0069710 A1 * | 3/2017 | Che | H01L 28/60 |
| 2018/0190761 A1 * | 7/2018 | Chiang | H01L 28/90 |
| 2019/0385657 A1 * | 12/2019 | Augustine | H01L 27/1104 |

* cited by examiner

STATIC RANDOM-ACCESS MEMORY WITH CAPACITOR WHICH HAS FINGER-SHAPED PROTRUDENT PORTIONS AND RELATED FABRICATION METHOD

BACKGROUND OF THE INVENTION

1. Field of the Invention

The present invention relates to a static random-access memory (SRAM) structure and a related fabrication method, and more particularly to a static random-access memory structure in which the capacitor has an electrode with finger-shaped protrudent portions and a related fabrication method.

2. Description of the Prior Art

With the advance of semiconductor technology, size of the produced elements like transistor, capacitor or resistance are getting smaller and smaller, thereby increasing integration density of the elements per unit area. However, it still needs to keep on researching a method or a structure capable of increasing or maintaining efficiency of the elements in a limited area. Taking static random-access memory (SRAM) structure as an example, manufacturers still need to keep on researching to find out how to increase storage capacity of the capacitor in a smaller unit area.

SUMMARY OF THE INVENTION

One of the purposes of the present invention is to produce a capacitor unit having a first electrode and a second electrode with S-shaped surface areas in a SRAM structure, thereby increasing the storage capacity of the SRAM structure.

The present invention provides a SRAM structure including a substrate, a first conductive type transistor, a second conductive type transistor, an insulating layer and a capacitor unit. The first conductive type transistor and the second conductive type transistor are both disposed on the surface of the substrate. The insulating layer is disposed on the substrate and includes a cavity located between the first conductive type transistor and the second conductive type transistor. The cavity exposes a portion of the surface of the substrate. The capacitor unit is disposed in the cavity and includes a first electrode, a second electrode, and a dielectric layer. The first electrode includes a plurality of first protrudent portions and a first planar portion, wherein the first planar portion covers the exposed portion of the surface of the substrate and is simultaneously electrically connected to a source/drain of the first conductive type transistor and a source/drain of the second conductive type transistor. The first protrudent portions are connected to the first planar portion in common and protrude away the surface of the substrate from the first planar portion, of the first planar portion. The second electrode includes a plurality of second protrudent portions and a second planar portion, wherein the second planar portion is disposed on the first protrudent portions, and the second protrudent portions are connected to the second planar portion in common and protrude toward the surface of the substrate from the second planar portion. The first protrudent portions and the second protrudent portions are alternately arranged in parallel with each other. The dielectric layer is disposed between the second electrode and the first electrode.

The present invention further provides a fabrication method of a SRAM structure which includes providing a substrate with a first conductive type transistor, a second conductive type transistor and a first insulating layer disposed on a surface of the substrate, wherein the first insulating layer covers the first conductive type transistor and the second conductive type transistor; form a cavity in the first insulating layer, wherein the cavity is located between the first conductive type transistor and the second conductive type transistor and exposes a source/drain of the first conductive type transistor and a source/drain of the second conductive type transistor; forming a first metal layer which covers a top surface of the first insulating layer and a sidewall and a bottom surface of the cavity; removing a portion of the first metal layer located on the top surface of the first insulating layer; and performing a protrudent portion forming process by multiple times to form a plurality of first protrudent portions in the cavity and form a sacrificing layer between any adjacent two of the first protrudent portions. The protrudent portion forming process includes: blanketly forming a sacrificing layer on the substrate such that the sacrificing layer covers the top surface of the first insulating layer and the sidewall and the bottom surface of the cavity; performing a step of partially removing the sacrificing layer so as to remove a portion of the sacrificing layer that is located on the top surface of the first insulating layer and covers the bottom surface of the cavity; blanketly forming a second metal layer such that the second metal layer covers the top surface of the first insulating layer and the sidewall and the bottom surface of the cavity; and performing a step of partially removing the second metal layer so as to remove a portion of the second metal layer that is located on the top surface of the first insulating layer and covers the bottom surface of the cavity, wherein after the step of partially removing the second metal layer, a portion of the second metal layer remained in the cavity is defined as a first protrudent portion. The fabrication method further includes: after repeating the protrudent portion forming process by multiple times, completely removing the sacrificing layer to form a plurality of recesses between the plurality of first protrudent portions; blanketly forming a dielectric layer to cover the surfaces of the plurality of first protrudent portions and a surface of the first insulating layer; blanketly forming a third metal layer on the substrate to fill the plurality of recesses and cover the top surfaces of the plurality of first protrudent portions and the top surface of the dielectric layer; and removing a portion of the third metal layer and a portion of the dielectric layer simultaneously to expose at least a portion of the first conductive type transistor and at least a portion of the second conductive type transistor in a top view. The first metal layer and the second metal layer remained on the substrate are defined as a first electrode, the third metal layer remained on the substrate is defined as a second electrode, and the first electrode, the second electrode and the dielectric layer compose a capacitor unit.

Since the first electrode included in the capacitor unit of the SRAM structure of the present invention has a plurality of first protrudent portions, the total surface area of the first electrode is thereby increased, and the storage capacity of the capacitor is also increased. Thus, a SRAM structure with greater storage capacity can be produced according to the fabrication method of the present invention.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
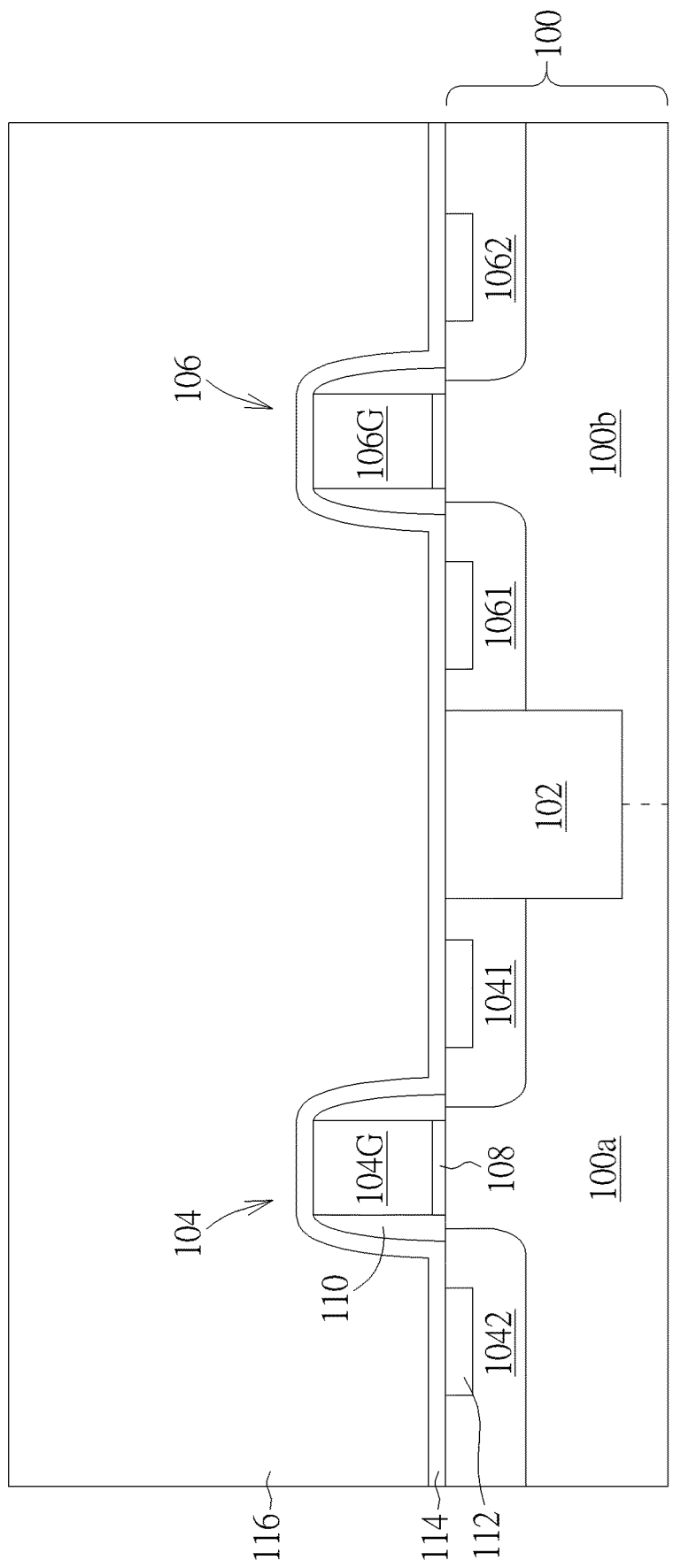
FIG. 1 to FIG. 12 schematically illustrate a fabrication method of a SRAM structure according to a first embodiment of the present invention.

Referring to FIG. 1 to FIG. 12, FIG. 1 to FIG. 12 schematically illustrate a fabrication method of a SRAM structure according to a first embodiment of the present invention. First, as shown in FIG. 1, a substrate 100 is provided. The substrate 100 is a semiconductor substrate such as a silicon substrate, a silicon epitaxy substrate, a silicon-germanium semiconductor substrate, a silicon carbide substrate or a silicon-on-insulator (SOI), but not limited thereto. The surface of the substrate 100 has a first conductive type transistor 104 and a second conductive type transistor 106 disposed adjacent to each other. For example, the first conductive type transistor 104 of this embodiment is a p-type metal-oxide-semiconductor (PMOS) transistor, and the second conductive type transistor 106 of this embodiment is a n-type metal-oxide-semiconductor (NMOS) transistor. In different embodiments, the conductive types of these two transistors can be exchanged. The surface of the substrate 100 includes an n-type well 100a and a p-type well 100b disposed adjacent to each other. The first conductive type transistor 104 is disposed on the n-type well 100a and includes a gate 104G and two first doped regions 1041 and 1042 formed in the n-type well 100a, wherein the first doped region 1041 and the first doped region 1042 may respectively be a p+ doped region and located on two sides of the gate 104G to serve as a source/drain of the first conductive type transistor 104. A gate insulating layer 108 is disposed between the gate 104G and the substrate 100, and a spacer 110 may be disposed at the outer side of the gate 104G. Similarly, the second conductive type transistor 106 is disposed on the p-type well 100b and includes a gate 106G and two second doped regions 1061 and 1062 formed in the p-type well 100b, wherein the second doped region 1061 and the second doped region 1062 may respectively be a n+ doped region and located on two sides of the gate 106G to serve as a source/drain of the second conductive type transistor 106. A gate insulating layer 108 is disposed between the gate 106G and the substrate 100, and a spacer 110 may be disposed at the outer side of the gate 106G. Besides, in this embodiment, a shallow trench isolation (STI) 102 may be formed on the surface of the substrate 100, positioned between the n-type well 100a and the p-type well 100b to electrically isolate the first doped region 1041 of the first conductive type transistor 104 and the adjacent second doped region 1061 of the second conductive type transistor 106. In a variant embodiment, the shallow trench isolation 102 may be omitted. A portion of the surface of the first doped regions 1041 and 1042 and a portion of the second doped regions 1061 and 1062 may have a metal silicide layer 112 such as including cobalt silicide material, but not limited thereto. Furthermore, a contact etch stop layer (CESL) 114 may cover the surface of the first conductive type transistor 104, the second conductive type transistor 106 and the surface of the substrate 100. Then, a first insulating layer 116 is formed on the substrate 100. The first insulating layer 116 covers the first conductive type transistor 104 and the second conductive type transistor 106.

Figure 2:
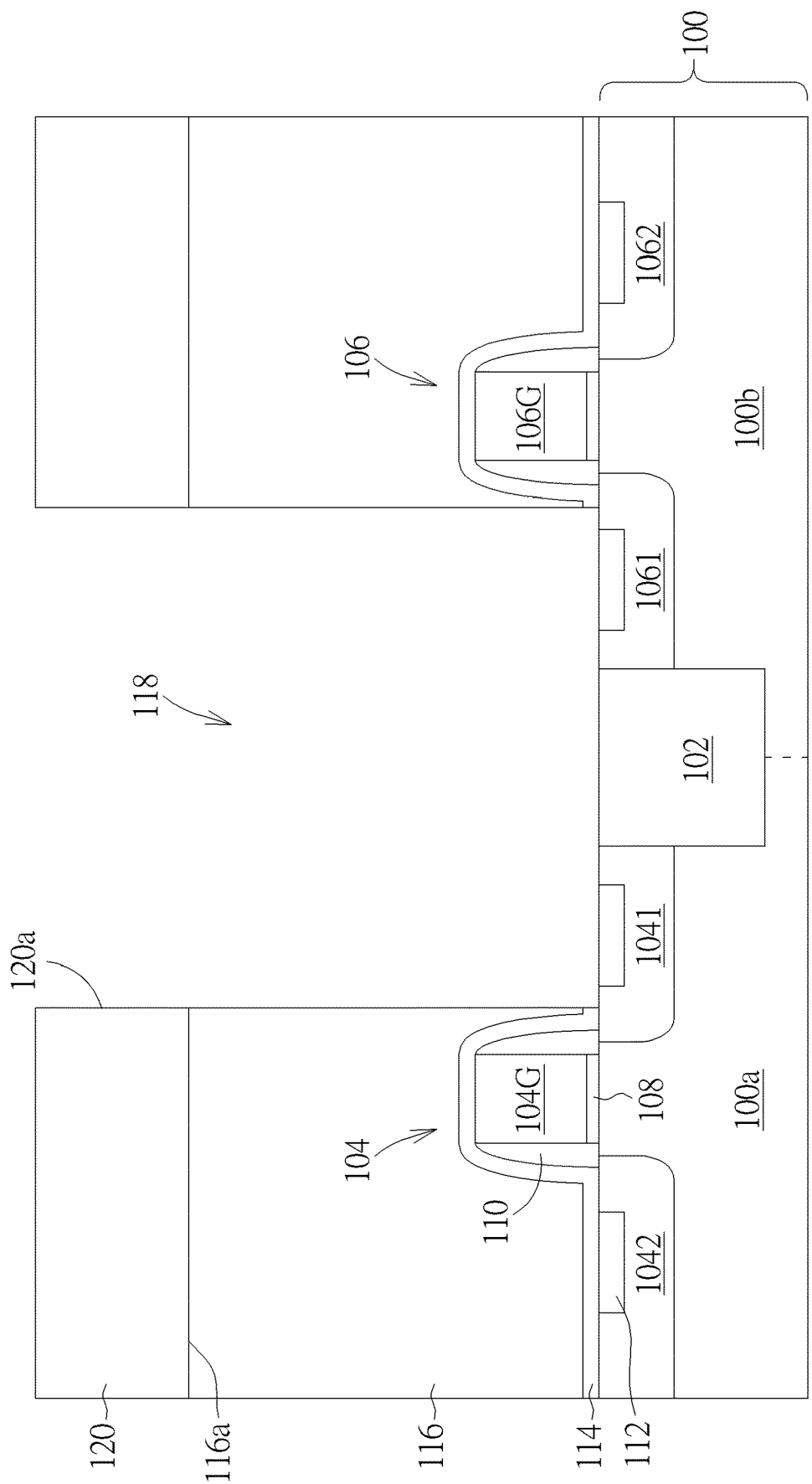

After that, as shown in FIG. 2, a cavity 118 is formed in the first insulating layer 116, wherein the cavity 118 is located between the first conductive type transistor 104 and the second conductive type transistor 106 and exposes the first doped region 1041 (that is, a source/drain of the first conductive type transistor 104) and the second doped region 1061 (that is, a source/drain of the second conductive type transistor 106). The cavity 118 may be formed by a photolithography and etching process (PEP) which for example includes: forming a patterned first photoresist layer 120 on the first insulating layer 116, wherein the photoresist layer 120 has an opening 120a that defines the predetermined position of the cavity 118; and using the patterned first photoresist layer 120 as an etching mask to remove a portion of the first insulating layer 116 not covered by the first photoresist layer 120 through an etching process until the surface of the substrate 100 is exposed, such that the cavity 118 exposes the first doped region 1041 and the second doped region 1061. It is noted that the contact etch stop layer 114 exposed by the opening 120a should be also removed at the same time when the cavity 118 is being formed in this embodiment.

Figure 3:
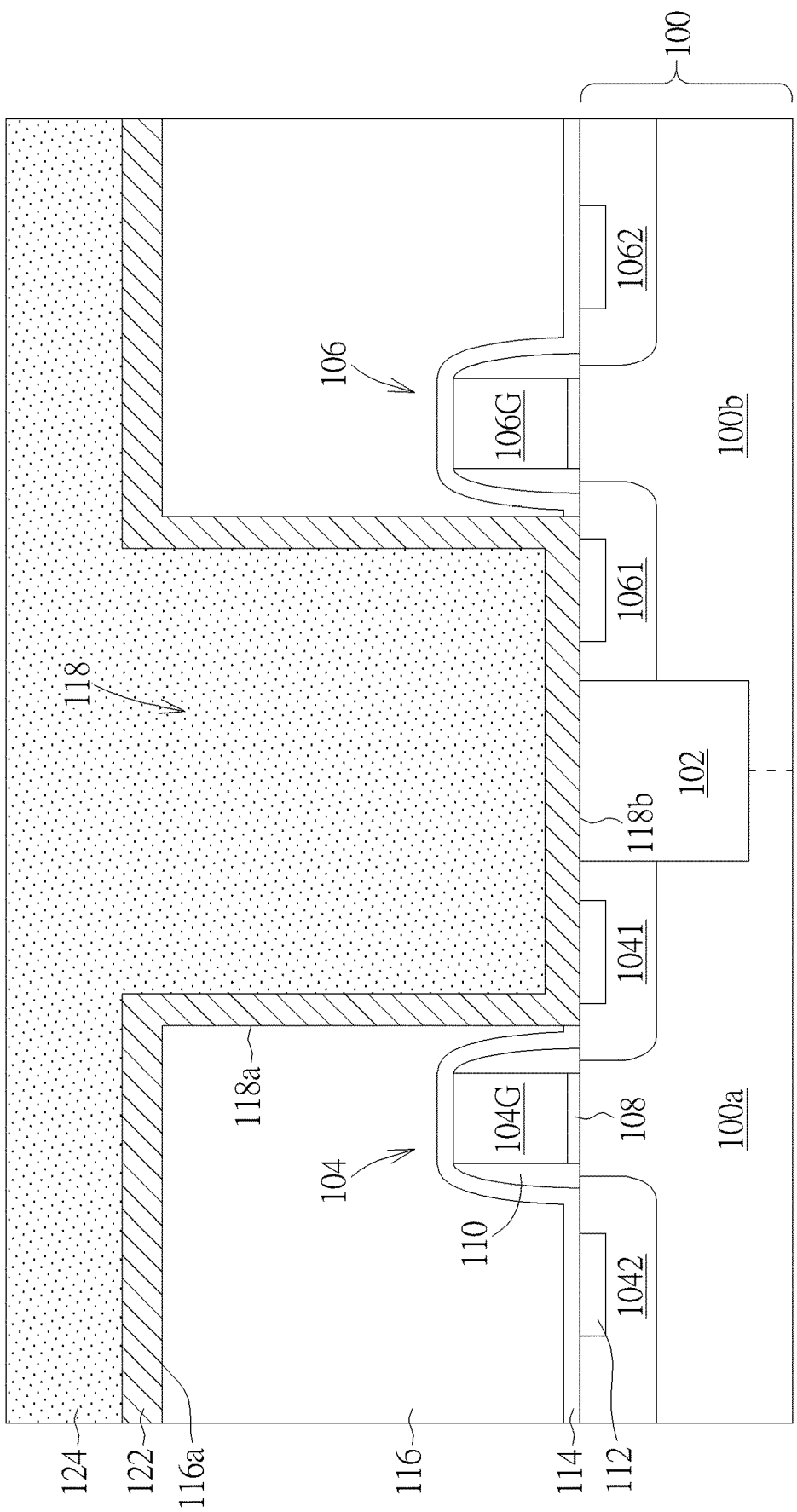
Figure 4:
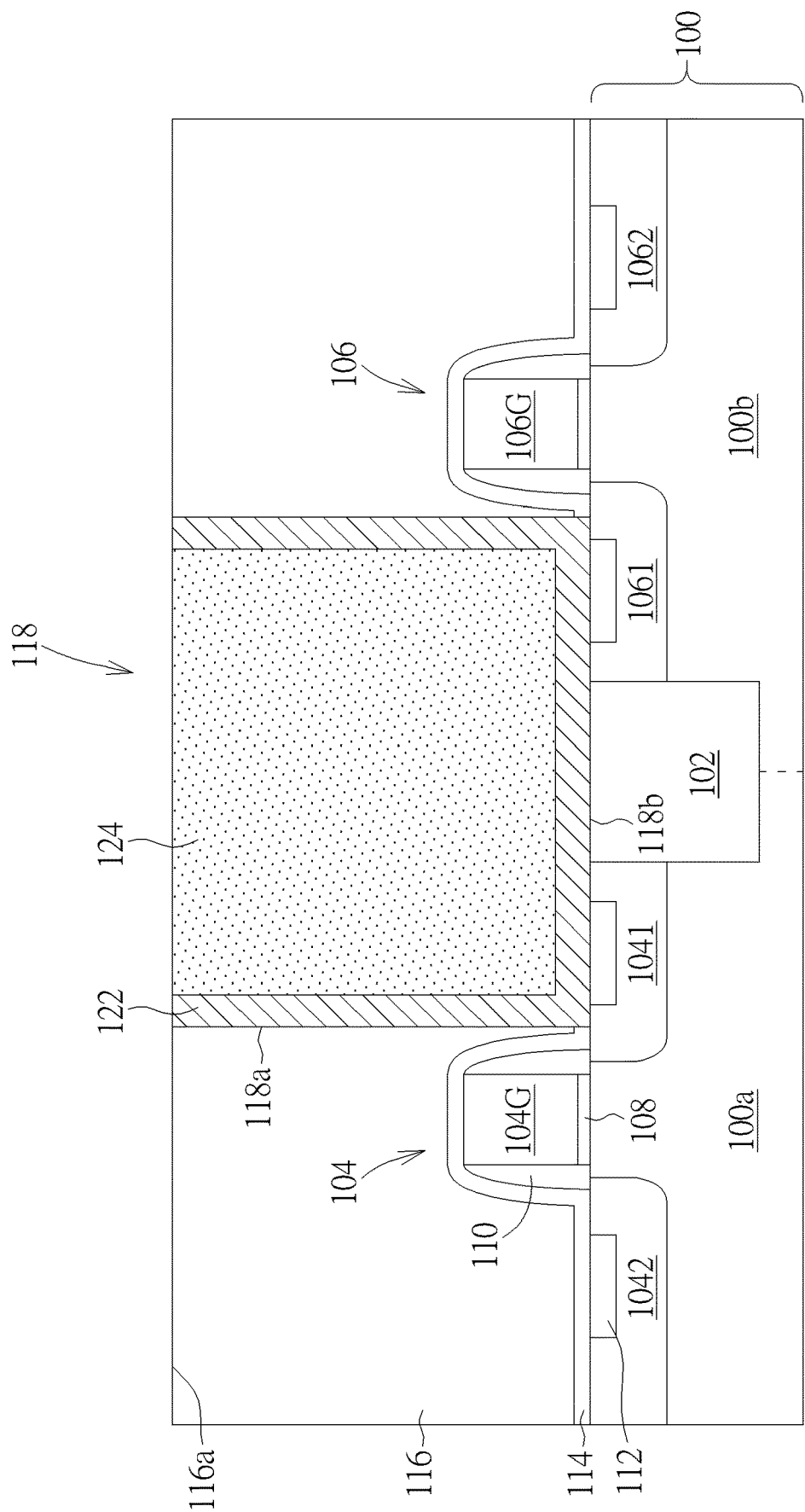

Then, as shown in FIG. 3, a first metal layer 122 is blanketly formed on the substrate 100, wherein the first metal layer 122 covers the top surface 116a of the first insulating layer 116 and the sidewall 118a and the bottom surface 118b of the cavity 118. The first metal layer 122 may be formed by any suitable deposition process such as physical vapor deposition (PVD) or chemical vapor deposition (CVD), but not limited thereto. The material of the first metal layer 122 may be any conductive material that includes metal. The first metal layer 122 in this embodiment may for example be a titanium nitride (TiN) layer, but not limited thereto. Next, a planarization layer 124 is formed on the substrate 100 to fill the cavity 118 and cover the top surface 116a of the first insulating layer 116. The planarization layer 124 may for example include organic material. After that, as shown in FIG. 4, an etching-back process or a polishing process is performed to remove a portion of the planarization layer 124 and a portion of the first metal layer 122 on the top surface 116a of the first insulating layer 116. The etching-back process may for example be a dry etching process. The polishing process may for example be a chemical mechanical polishing (CMP) process. In this embodiment, the polishing process is taken as an example, and the top surface 116a of the first insulating layer 116 is regarded as a polish stop layer to remove the planarization layer 124 and the first metal layer 122 above the first insulating layer 116 through polishing.

Figure 5:
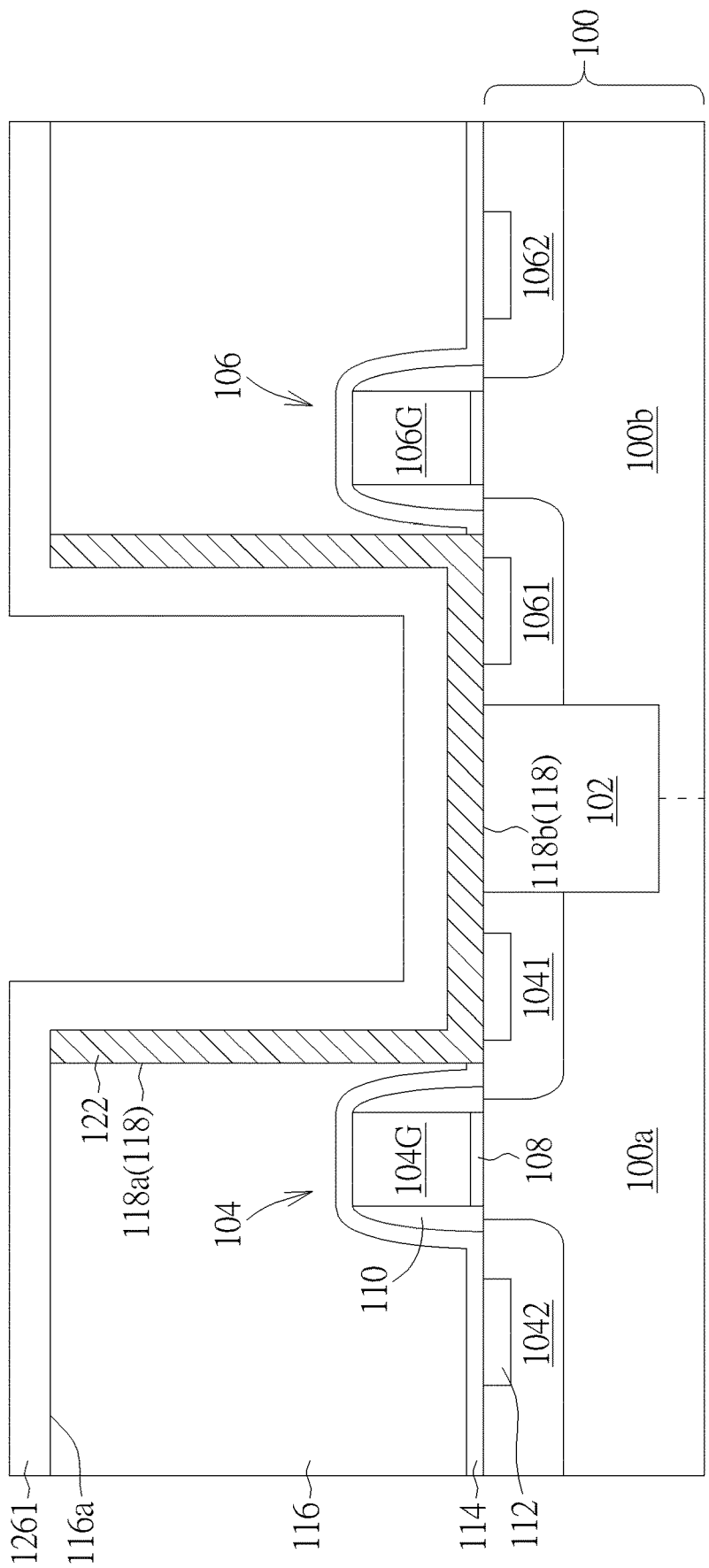

Referring to FIG. 5, after that, the remaining planarization layer 124 in the cavity 118 may be removed by dry etching or wet etching, and the remaining first metal layer 122 covers the sidewall 118a and the bottom surface 118b of the cavity 118. In this embodiment, filling the planarization layer 124 into the cavity 118 and removing the planarization layer 124 and the first metal layer 122 on the first insulating layer 116 simultaneously is only an example, any other method capable of removing the portion of the first metal layer 122 on the first insulating layer 116 can be applied in the present invention. After the planarization layer 124 is removed, a sacrificing layer 1261 is blanketly formed on the substrate 100, such that the sacrificing layer 1261 covers the top surface 116a of the first insulating layer 116 and the sidewall 118a and the bottom surface 118b of the cavity 118. The material of the sacrificing layer 1261 may be selected to have a high etching selectivity relative to the material of the first metal layer 122. The sacrificing layer 1261 in this embodiment for example includes tungsten, but not limited thereto.

Figure 6:
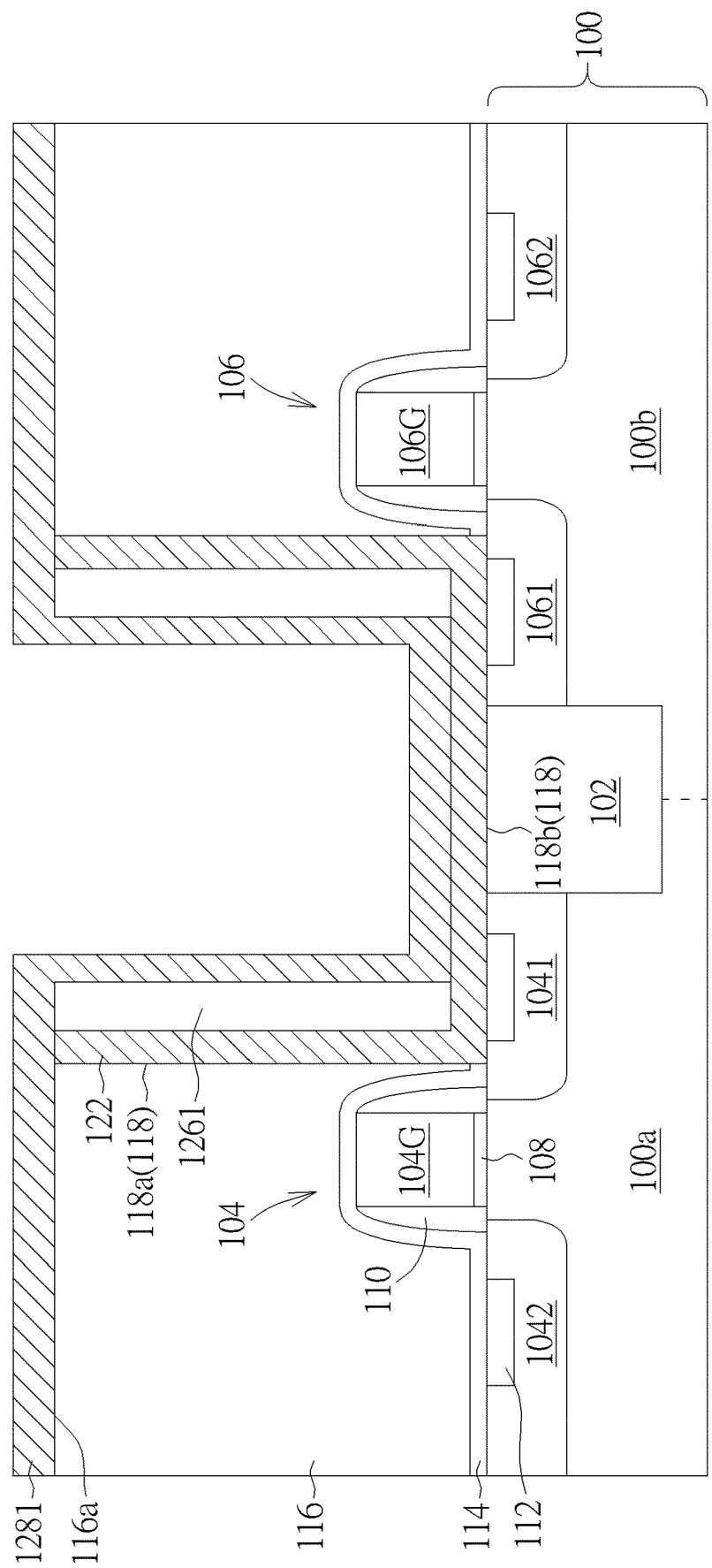
Figure 7:
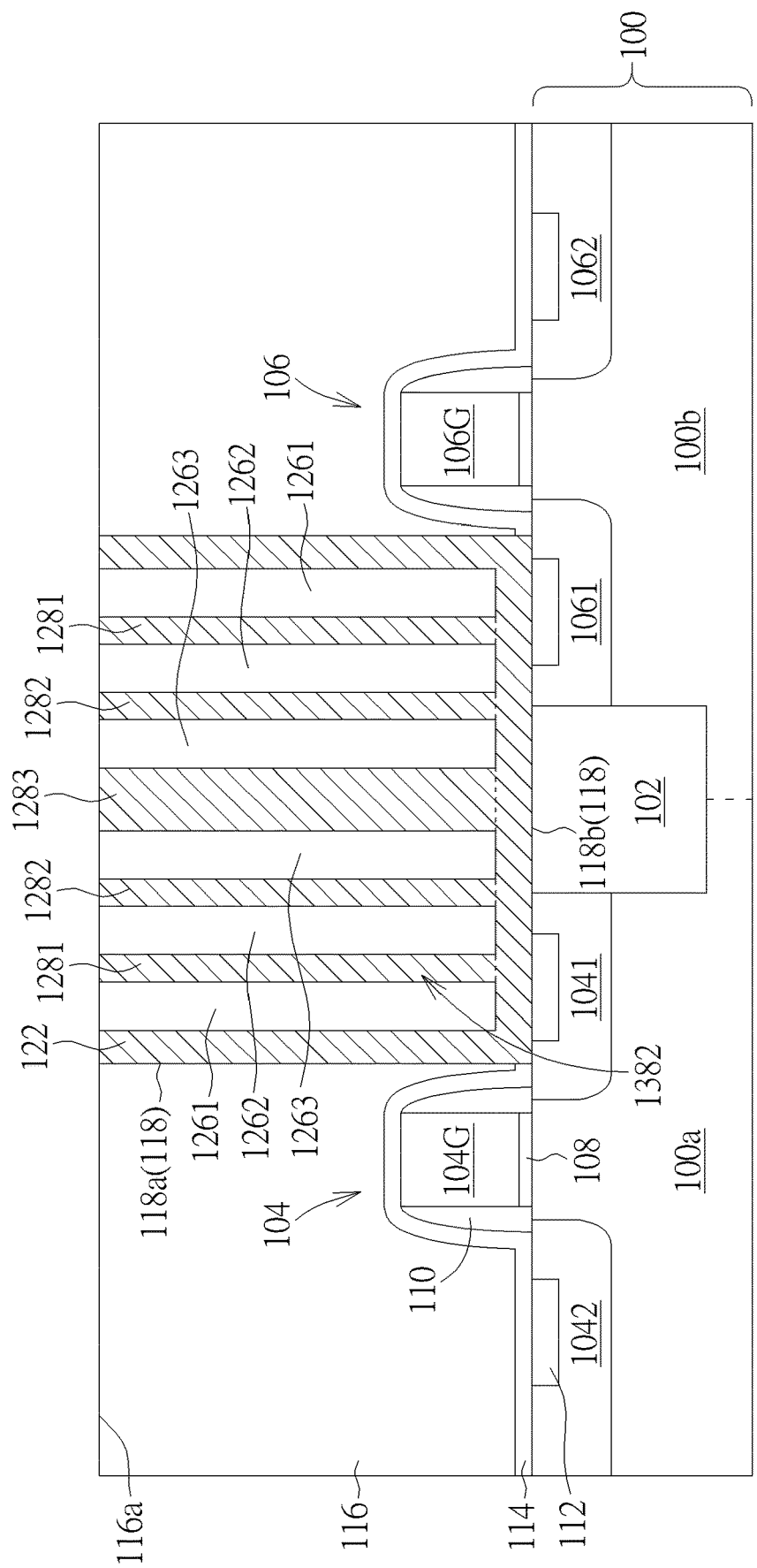

Referring to FIG. 6, next, a step of partially removing the sacrificing layer, such as an etching-back process, is performed to remove a portion of the sacrificing layer 1261 that is located on the top surface 116a of the first insulating layer 116 and covers the bottom surface 118b of the cavity 118, such that the remaining sacrificing layer 1261 only covers the sidewall 118a of the cavity 118. After that, a second metal layer 1281 is blanketly formed on the substrate 100, such that the second metal layer 1281 covers the sidewall 118a and the bottom surface 118b of the cavity 118, that is, covers the sacrificing layer 1261 located in the cavity 118. The material of the second metal layer 1281 may be any suitable metal material, which may be the same as the material of the first metal layer 122 or different from the material of the first metal layer 122. In this embodiment, the material of the second metal layer 1281 is selected to be the same as the material of the first metal layer 122, that is the second metal layer 1281 is a titanium nitride layer. Next, a step of partially removing the second metal layer is performed to remove a portion of the second metal layer 1281 that is located on the top surface 116a of the first insulating layer 116 and covers the bottom surface 118b of the cavity 118, such that the remaining second metal layer 1281 only covers the sidewall 118a of the cavity 118, as shown in FIG. 7. After the step of partially removing the second metal layer, a portion of the second metal layer 1281 remained in the cavity 118 may be defined as a first protrudent portion 1382. The step of partially removing the second metal layer may for example using an etching-back process. The abovementioned processes of forming the sacrificing layer, partially removing the sacrificing layer, forming the second metal layer and partially removing the second metal layer may be regarded as a protrudent portion forming process (or a cycle of forming protrudent portion) for forming a first protrudent portion 1382 in the cavity 118. The fabrication process of this embodiment includes carry out multiple times of protrudent portion forming processes, so as to from a plurality of first protrudent portions 1382 in the cavity 118. As shown in FIG. 7, the plurality of first protrudent portions 1382 include the sequentially formed second metal layer 1281, second metal layer 1282 and second metal layer 1283, and the sacrificing layers 1261, 1262 and 1263 are formed between adjacent two of the first protrudent portions 1382. Besides, the portion of the first metal layer 122 covering the surface of the sidewall 118a of the cavity 118 may be also regarded as the first protrudent portions 1382. As mentioned above, after performing multiple times of the protrudent portion forming process, the cavity 118 is filled with the first protrudent portions 1382 and the sacrificing layers 1261, 1262 and 1263 disposed between adjacent first protrudent portions 1382. The top surfaces of the first protrudent portions 1382 are substantially aligned with the top surface 116a of the first insulating layer 116. It is noted that the number of the first protrudent portions 1382 in the cavity 118 mentioned above is only an example, and the number of the first protrudent portions 1382 may be different in different embodiments.

Figure 8:
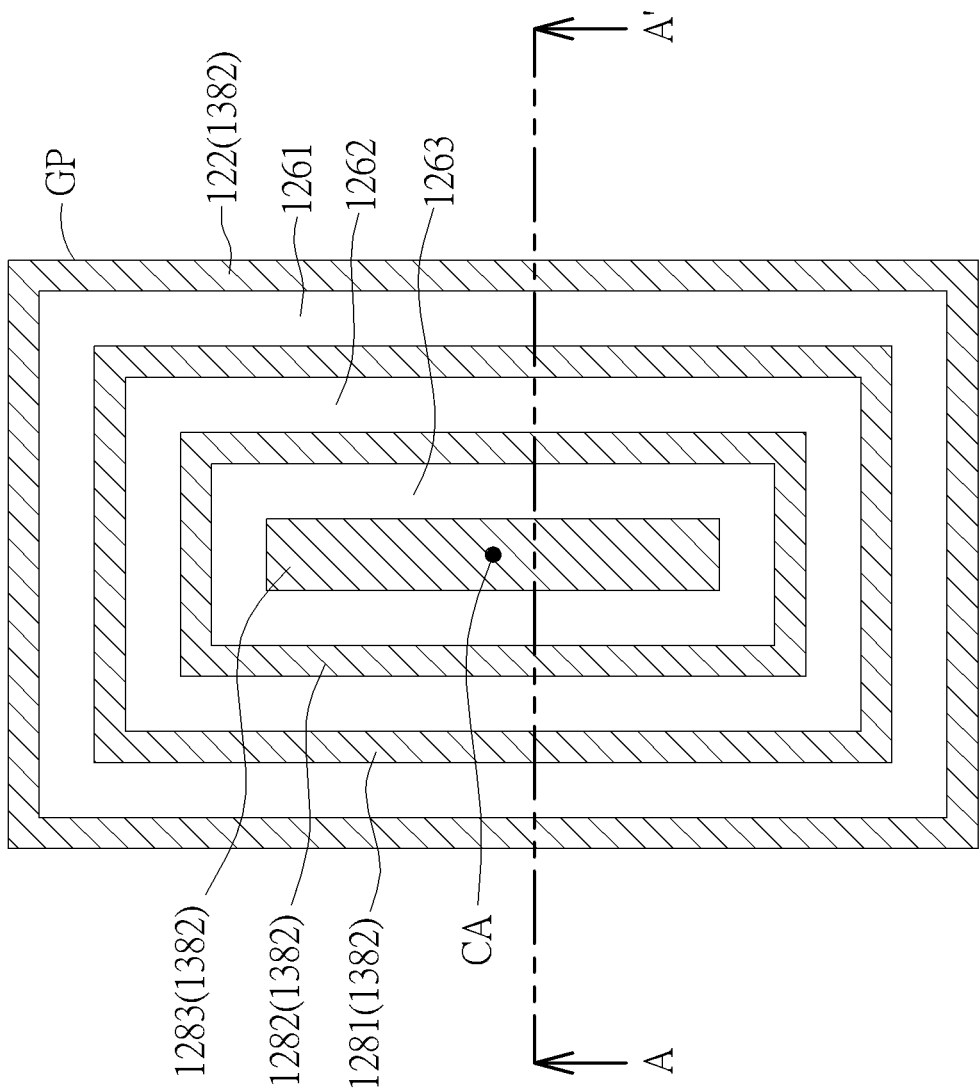

Referring to FIG. 8, FIG. 8 schematically illustrates a top view of the sacrificing layer and the metal layer shown in FIG. 7, wherein FIG. 7 may be regarded as the sectional figure drawn along the cross line A-A' in FIG. 8. As shown in FIG. 8, the first protrudent portions 1382 formed of the first metal layer 122 and the second metal layers 1281, 1282 and 1283 show a plurality of geometric patterns GP having a common geometric center CA, and the geometric patterns GP are arranged from inward to outward in order by regarding the common geometric center CA as a central axis. In this embodiment, the geometric patterns GP of the first protrudent portions 1382 are rectangles or squares, but not limited thereto. In other embodiments, the geometric patterns GP may be other patterns, such as circles or ellipses.

Figure 9:
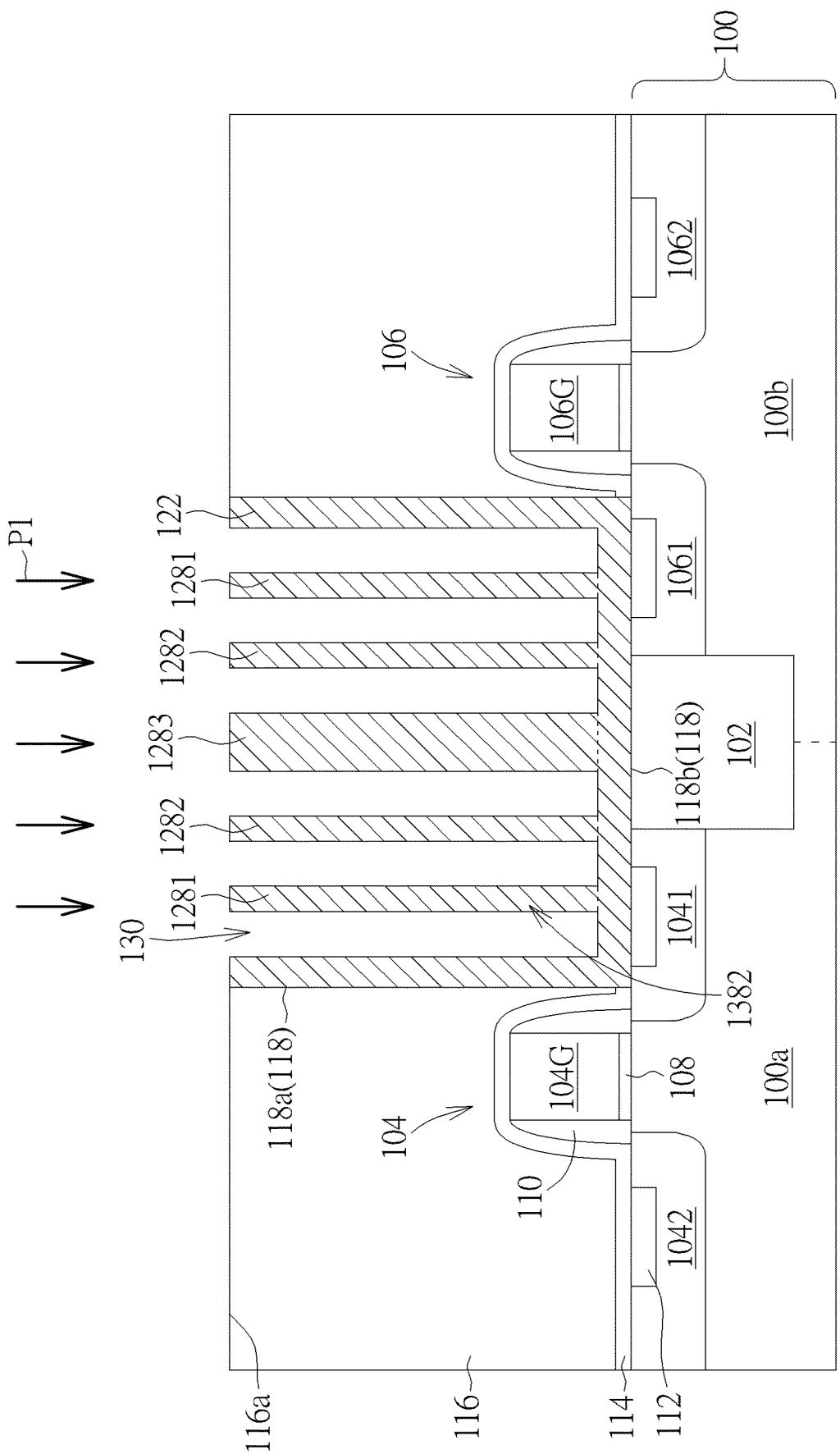

Referring to FIG. 9, after performing multiple times of the protrudent portion forming processes, the sacrificing layers 1261, 1262 and 1263 are completely removed to form a plurality of recesses 130 between the first protrudent portions 1382. For example, the step of removing the sacrificing layers may be performed by a wet etching process P1, and the selected etchant of the process may include DSP solution, such as a solution containing hydrogen peroxide and diluted sulfuric acid or hydrofluoric acid or any other etchant having high etching rate (for example greater than or equal to 27 Å/min) to the sacrificing layer containing tungsten but having lower etching rate (for example lower than 1 Å/min) to the first metal layer 122 and the second metal layers 1281, 1282 and 1283 containing titanium nitride.

Figure 10:
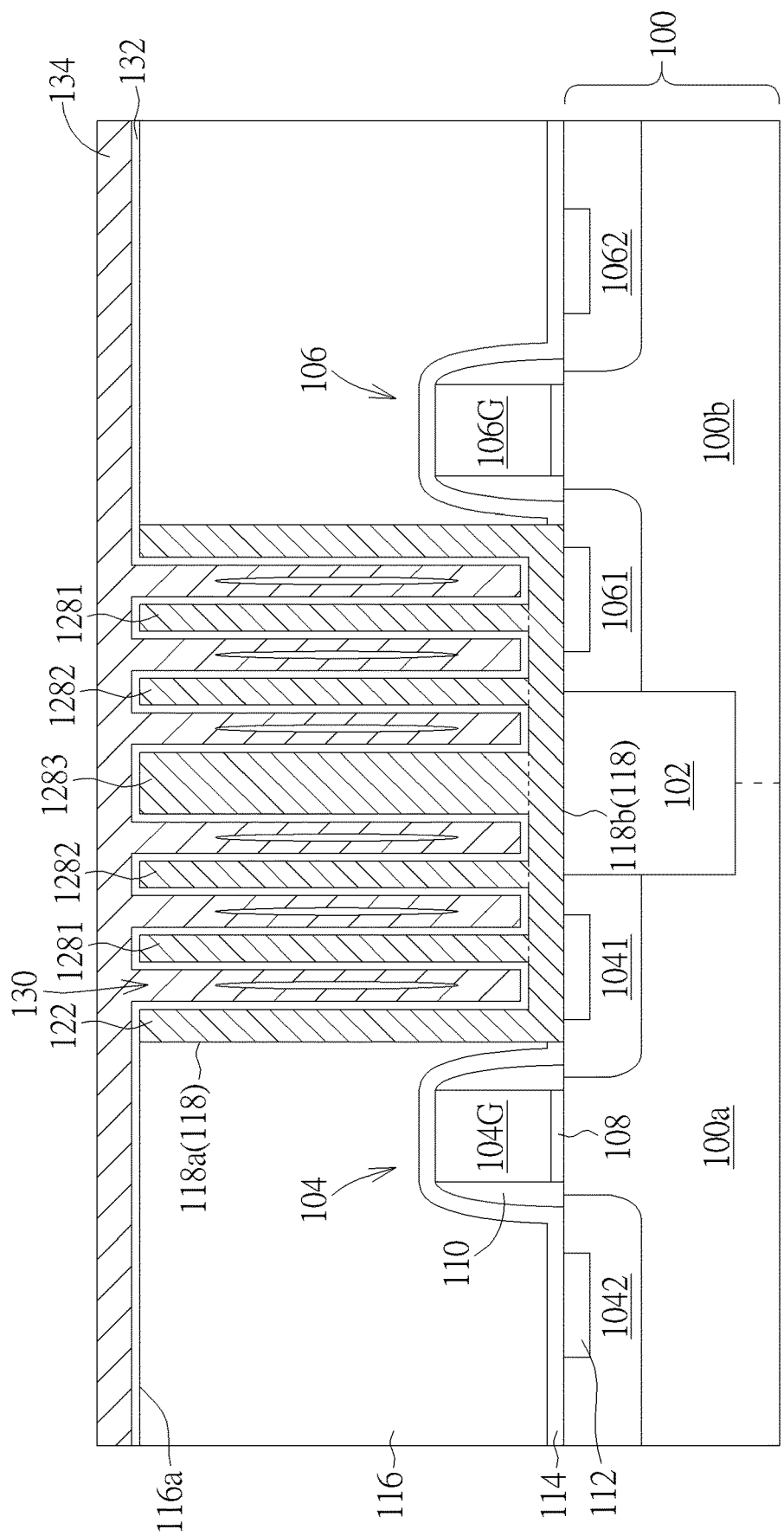

Referring to FIG. 10, a dielectric layer 132 is then blanketly formed on the substrate 100 to cover the surfaces of the first protrudent portions 1382 and the surface of the first insulating layer 116. The dielectric layer 132 may for example include high dielectric constant (high k) material. After that, a third metal layer 134 is blanketly formed on the substrate 100. The third metal layer 134 fills the recesses 130 and covers the top surfaces of the first protrudent portions 1382 and a top surface of the dielectric layer 132. The material of the third metal layer 134 may be the same as the first metal layer 122 and the second metal layers 1281, 1282 and 1283 or different from the first metal layer 122 and the second metal layers 1281, 1282 and 1283. In this embodiment, the third metal layer 134 for example includes titanium nitride, but the present invention is not limited thereto.

Figure 11:
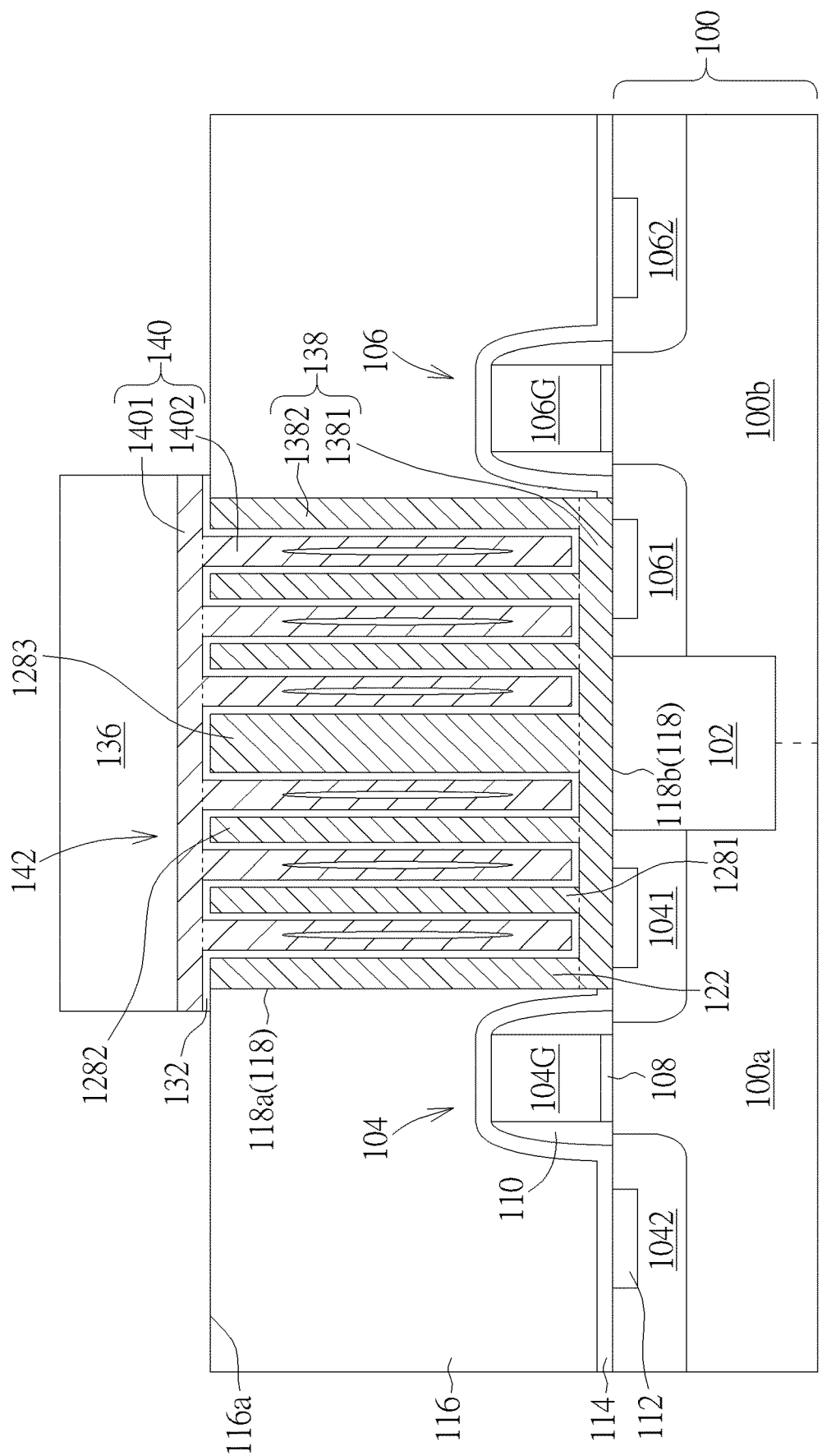

Referring to FIG. 11, after that, a photolithography process and etching process is performed to remove a portion of the third metal layer 134 and a portion of the dielectric layer 132, and a portion of the third metal layer 134 covering the first protrudent portions 1382 is remained. In detail, a patterned second photoresist layer 136 may be formed on the third metal layer 134, wherein the second photoresist layer 136 covers the first protrudent portion 1382 and exposes at least a portion of the first conductive type transistor 104 and at least a portion of the second conductive type transistor 106 which are located on two sides of the first protrudent portions 1382 in a top view. That is, at least the first doped region 1042 of the first conductive type transistor 104 and at least the second doped region 1062 of the second conductive type transistor 106 are exposed. After that, an etching process is performed to etch the third metal layer 134 and the dielectric layer 132 until the first insulating layer 116 is exposed by taking the second photoresist layer 136 as an etching mask and the first insulating layer 116 as an etching stop layer, thereby forming a capacitor unit 142. As shown in FIG. 11, the first metal layer 122 and the second metal layers 1281, 1282 and 1283 remained on the substrate 100 are defined as a first electrode 138 as a whole of the capacitor unit 142, and the third metal layer 134 remained on the substrate 100 is defined as a second electrode 140 of the capacitor unit 142. The dielectric layer 132, the first electrode 138 and the second electrode 140 compose the capacitor unit 142, thus the basic structure of the SRAM is formed.

Figure 12:
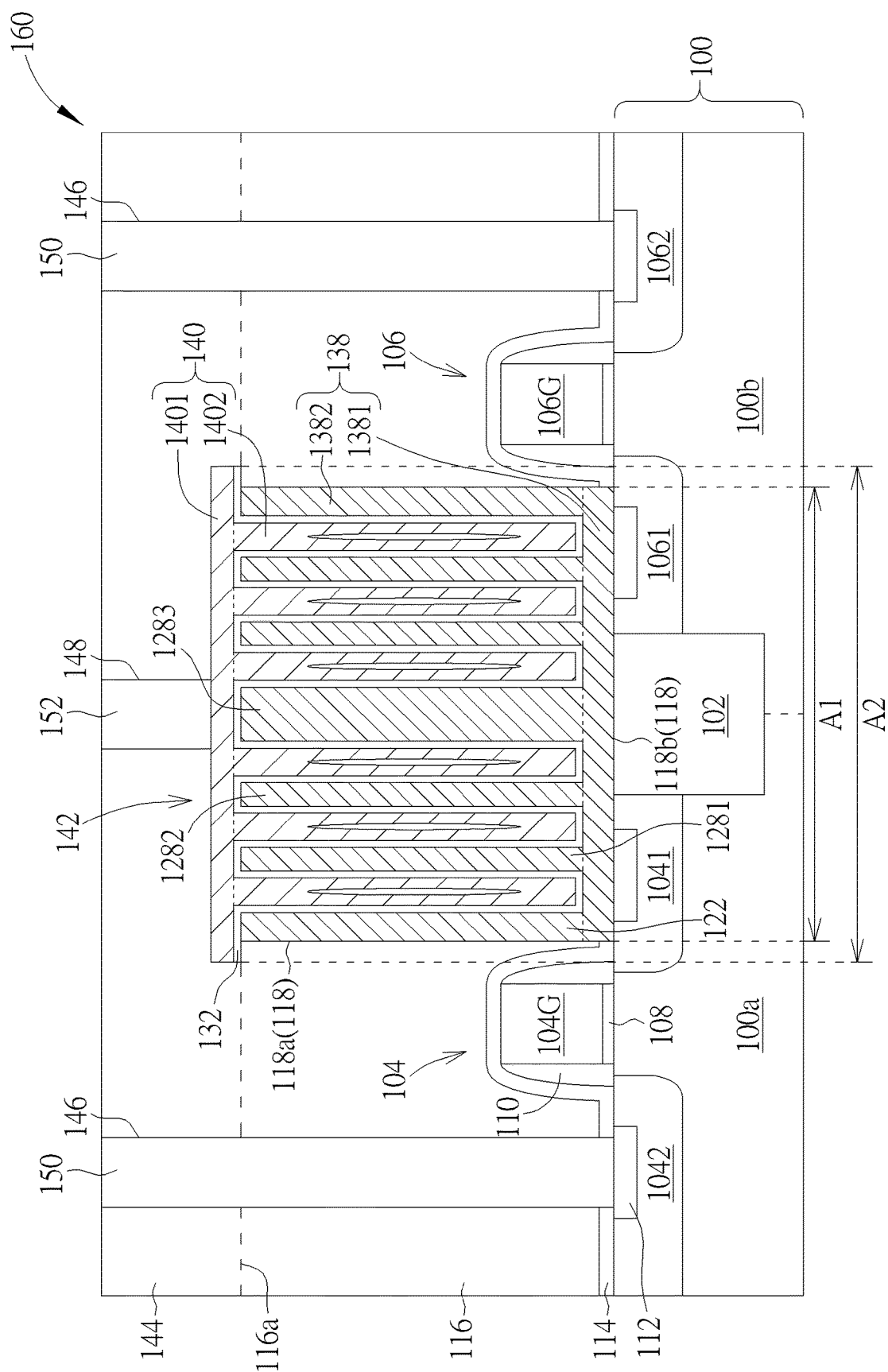

Then, referring to FIG. 12, a second insulating layer 144 is formed on the substrate 100 to cover the first insulating layer 116 and the capacitor unit 142. The material of the second insulating layer 144 may be the same as the first insulating layer 116 or different from the first insulating material 116. In this embodiment, both of the first insulating layer 116 and the second insulating layer 144 are for example a silicon oxide layer, but not limited thereto. After that, an etching process may be performed to remove a portion of the first insulating layer 116 and a portion of the second insulating layer 144 so as to form two first contact holes 146 in the first insulating layer 116 and the second insulating layer 144 and a second contact hole 148 in the second insulating layer 144, wherein the two first contact holes 146 expose a portion of the first doped region 1042 of the first conductive type transistor 104 and a portion of the second doped region 1042 of the second conductive type transistor 106 respectively, and the second contact hole 148 exposes a portion of the second electrode 140 of the capacitor unit 142. After that, the first contact holes 146 and the second contact hole 148 are filled with conductive material to form two first contact elements 150 and a second contact element 152. The conductive material may for example include tungsten, but not limited thereto. Production of the SRAM structure 160 of the present invention may be completed through the processes mentioned above.

As shown in FIG. 12, the SRAM structure 160 of the present invention includes a substrate 100, a first conductive type transistor 104, a second conductive type transistor 106, an insulating layer 116 and a capacitor unit 142. The first conductive type transistor 104, the second conductive type transistor 106 and the capacitor unit 142 are disposed on the surface of the substrate 100. The insulating layer 116 is disposed above the substrate 100 and includes a cavity 118 located between the first conductive type transistor 104 and the second conductive type transistor 106. The cavity 118 exposes a portion of the surface of substrate 100. The capacitor unit 142 is disposed in the cavity 118 and includes a first electrode 138, a second electrode 140 and a dielectric layer 132, wherein the dielectric layer 132 is disposed between the second electrode 140 and the first electrode 138. The first electrode 138 is electrically connected to a source/drain (the first doped region 1041) of the first conductive type transistor 104 and a source/drain (the second doped region 1061) of the second conductive type transistor 106 through direct contact. The first electrode 138 includes a plurality of first protrudent portions 1382 and a first planar portion 1381, wherein the first planar portion 1381 is a portion of first metal layer 122 covering the bottom surface 118b of the cavity 118. That is, the first planar portion 1381 covers the exposed portion of the surface of the substrate 100, extends along a horizontal (lateral) direction and is parallel to the surface of substrate 100. The first protrudent portions 1382 are connected to the first planar portion 1381 in common and protrude away the surface of the substrate 100 from the first planar portion 1381, wherein the shapes of the cross sections of the first protrudent portions 1382 are similar to finger-shape protrusions. Furthermore, the second electrode 140 includes a plurality of second protrudent portions 1402 and a second planar portion 1401, wherein the second planar portion 1401 is disposed on the first protrudent portions 1382. The second protrudent portions 1402 are connected to the second planar portion 1401 in common and protrude toward the surface of the substrate 100 from the second planar portion 1401. The first protrudent portions 1382 and the second protrudent portions 1402 are alternately arranged in parallel with each other. The second electrode 140 covers the top surfaces of the first protrudent portions 1382 and fills the spaces between the first protrudent portions 1382. According to this embodiment, the second electrode 140 is formed of the third metal layer 134, and the second protrudent portions 1402 are located between adjacent two of the first protrudent portions 1382. The second planar portion 1401 extends along a horizontal (lateral) direction and is parallel to the surface of substrate 100. The second planar portion 1401 covers the second protrudent portions 1402, the first protrudent portions 1382 and the first planar portion 1381. According to this embodiment, the second electrode 140 and the dielectric layer 132 partially extend above the surface of insulating layer 116. The planar portion 1401 of the second electrode 140 laterally protrudes from the outermost first protrudent portion 1382, such that in the capacitor unit 142, a projection area A2 of the second electrode 140 on the substrate 100 is greater than a projection area A1 of the first electrode 138 on the substrate 100. In other words, the second electrode 140 completely covers the first electrode 138 in a top view direction (the direction perpendicular to the surface of substrate 100). Besides, in the capacitor unit 142, a projection area of the dielectric layer 132 on the substrate 100 is substantially equal to the projection area A2 of the second electrode 140 on the substrate 100, that is, the projection area of the dielectric layer 132 on the substrate 100 is greater than the projection area A1 of the first electrode 138 on the substrate 100.

The SRAM structure and the related fabrication method of the present invention are not limited to the embodiment mentioned above. Other embodiments or variant embodiments of the present invention would be disclosed in the following content. In order to simplify the descriptions and highlight the difference between each of the embodiments or variant embodiments, the same elements would be labeled with the same symbol, and the repeated part would not be redundantly described in the following content.

Figure 13:
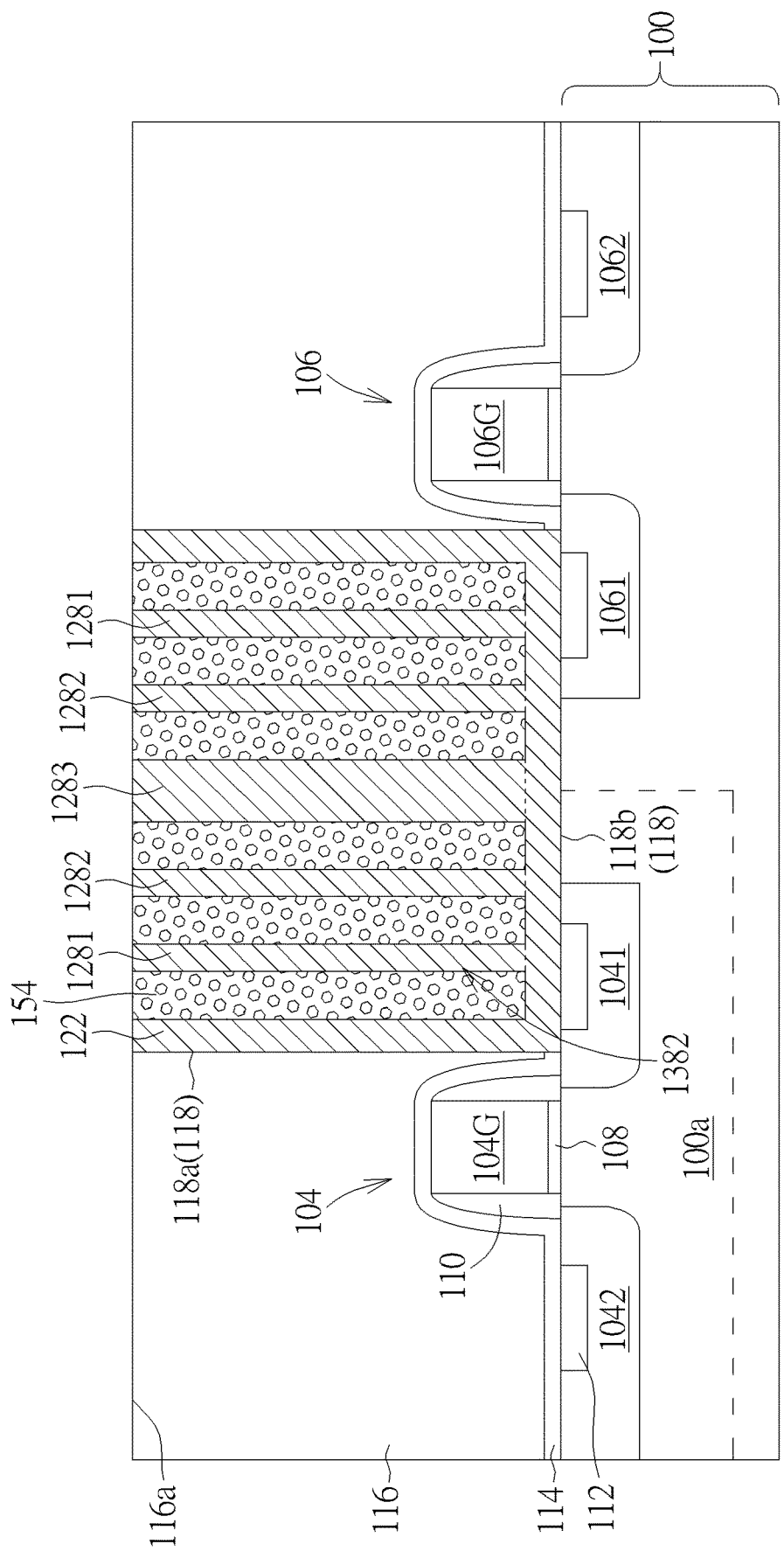
FIG. 13 to FIG. 16 schematically illustrate a fabrication method of a SRAM structure according to a second embodiment of the present invention.
Figure 14:
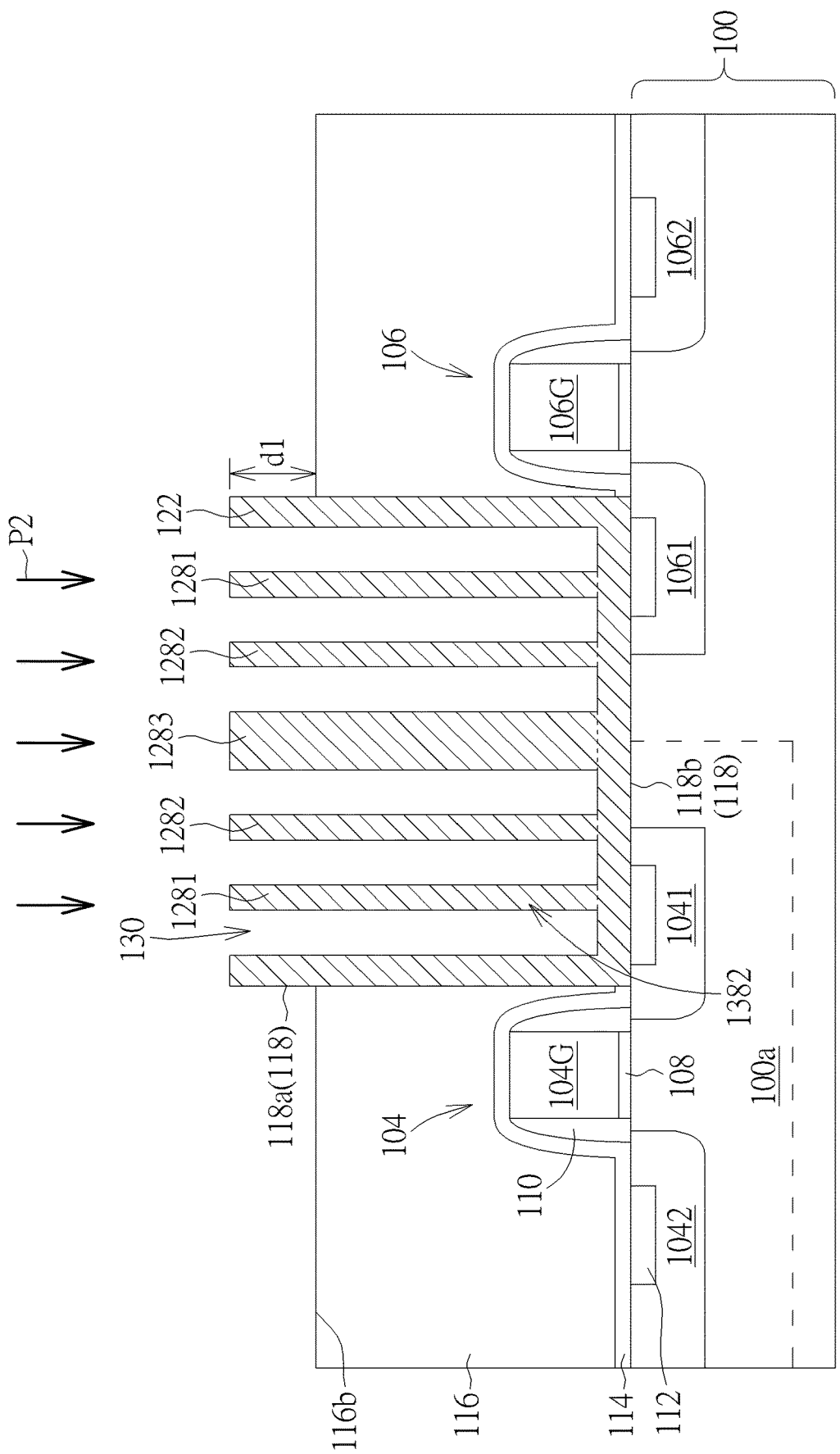

Referring to FIG. 13 to FIG. 16, FIG. 13 to FIG. 16 schematically illustrate the fabrication method of the SRAM structure according to a second embodiment of the present invention, wherein FIG. 13 is a sectional view subsequent to FIG. 5. The main difference between this embodiment and the first embodiment is that a different material is used to form the sacrificing layer in this embodiment. Besides, disposition of the doped wells on the substrate 100 in this embodiment is different from the disposition in the first embodiment. As shown in FIG. 13, the substrate 100 may be a p-type substrate in this embodiment, so the p-type well 100b in the previous embodiment does not exist and the shallow trench isolations 102 in FIG. 1 located between the p-type well 100b and the n-type well 100a may be omitted in this embodiment. In a variant embodiment, the surface of the substrate 100 may have a p-type well with a wide area and the n-type well 100a is formed in the p-type well. In the processes of this embodiment, after removing the first metal layer 122 located on the first insulating layer 116, a protrudent portion forming process is performed by multiple times to form a plurality of first protrudent portions 1382 in the cavity 118, which is similar to the first embodiment. However, the sacrificing layers 154 are formed with the material of silicon nitride in this embodiment. The sacrificing layers 154 are located between adjacent two of the first protrudent portions 1382. After that, as shown in FIG. 14, an etching process P2 is performed to remove the sacrificing layer 154 and form recesses 130 between the first protrudent portions 1382. The sacrificing layer 154 is removed through a dry etching in this embodiment, and a portion of the first insulating layer 116 may be removed during the etching process, such that a top portion of the first insulating layer 116 is removed and a new top surface 116b of the first insulating layer 116 is appeared. That is, the top surface 116b of first insulating layer 116 may be lower than the top surfaces of the first protrudent portions 1382, and a height difference between them is d1. However, this embodiment is not limited to adopting the dry etching process for performing the etching process P2. For example, an etchant with etching rate in silicon nitride greater than etching rate in silicon oxide and far greater than etching rate in titanium nitride may be chosen to perform a wet etching process.

Figure 15:
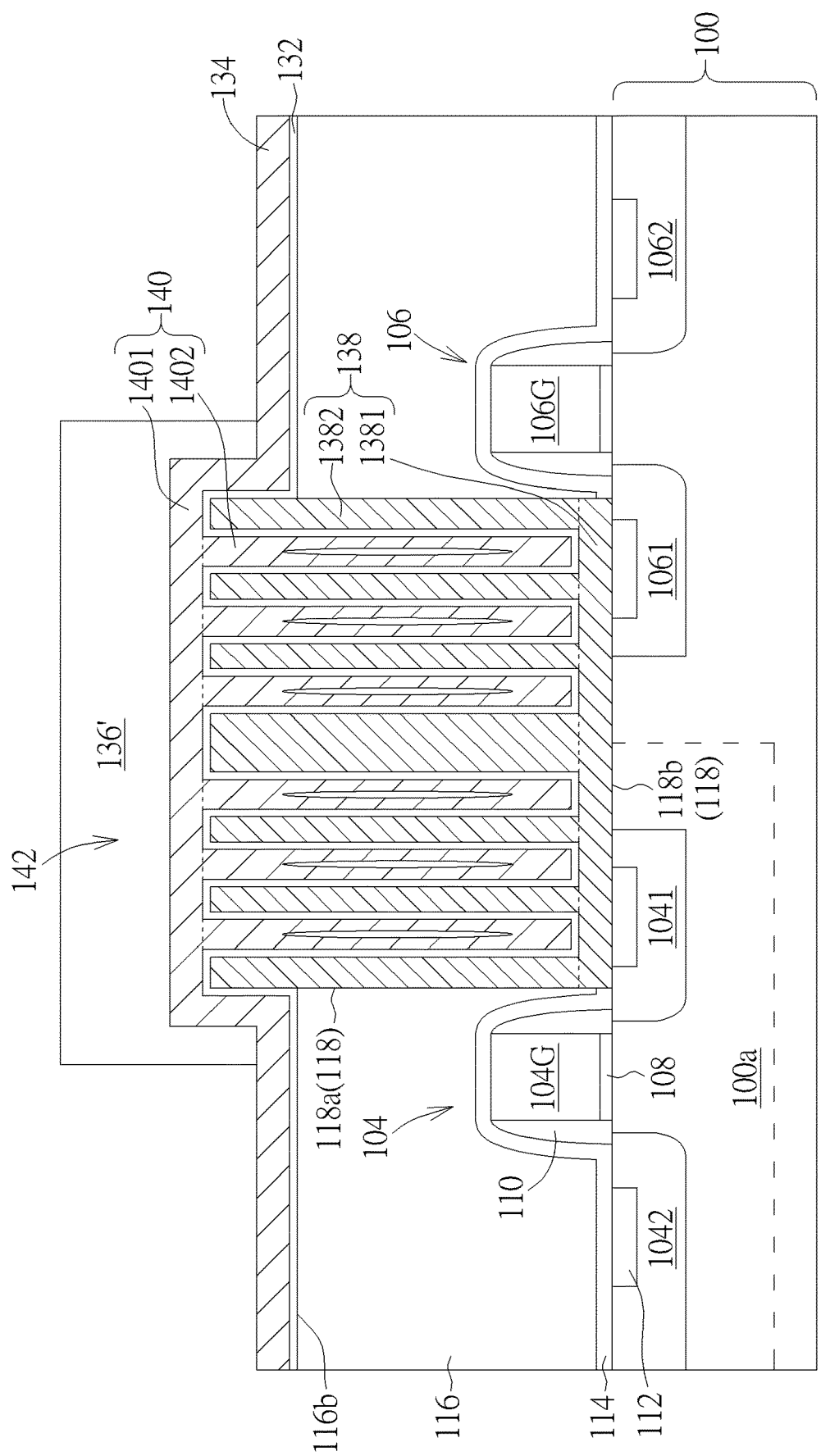
Figure 16:
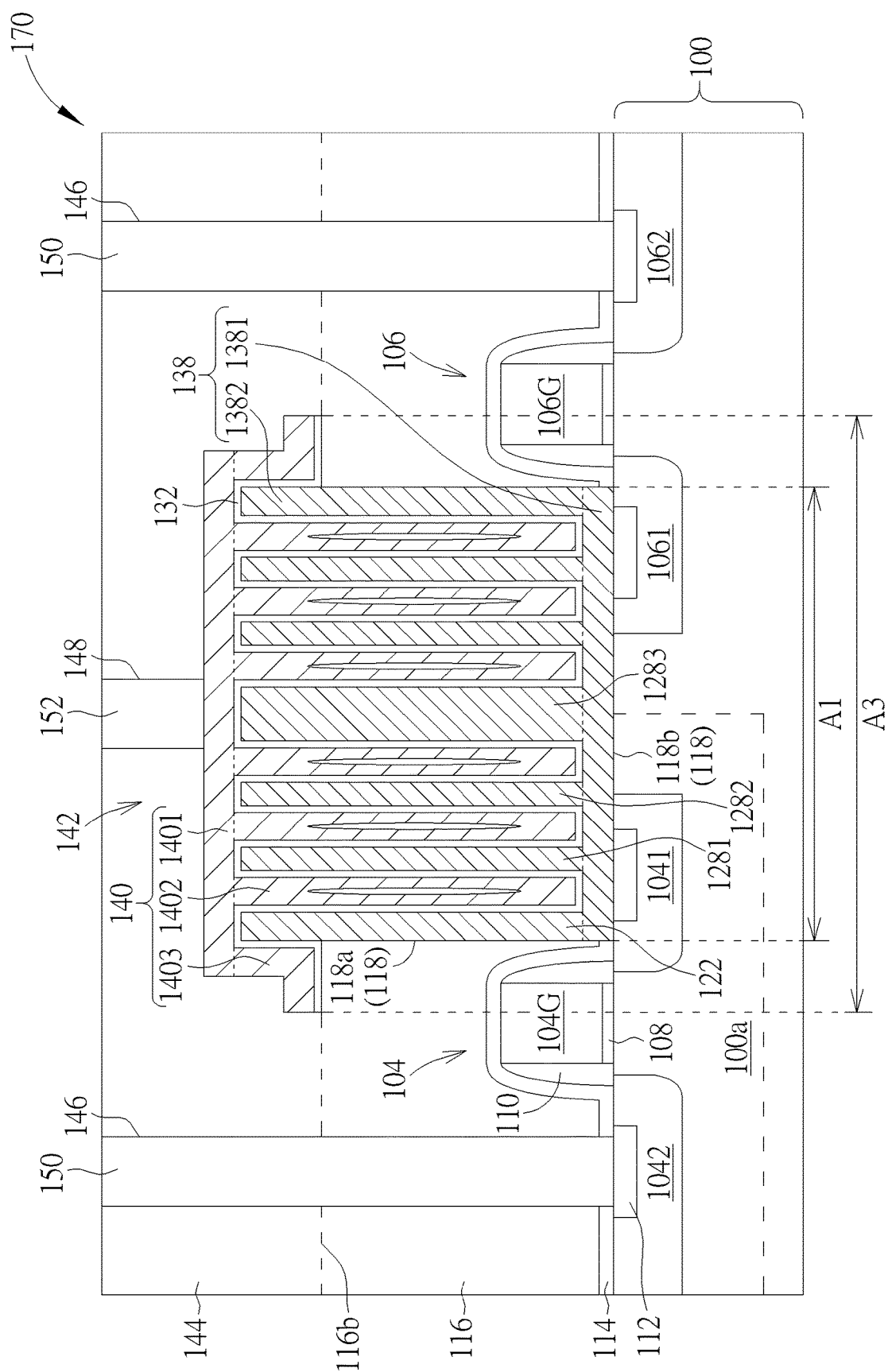

Referring to FIG. 15, after that, the dielectric layer 132 and the third metal layer 134 may be formed on the substrate 100 to fill the recesses 130 though the processes similar to the first embodiment. Next, a portion of the dielectric layer 132 and a portion of the third metal layer 134 on the first insulating layer 116 are removed through a photolithography and etching process. In the photolithography and etching process, a patterned photoresist layer 136' may be formed on the third metal layer 134 at first, wherein the photoresist layer 136' substantially covers the first protrudent portions 1382. After that, the exposed third metal layer 134 and dielectric layer 132 are removed by regarding the photoresist layer 136' as an etching mask, remaining a portion of the dielectric layer 132 and a portion of the third metal layer 134 on the substrate 100 are shown in FIG. 16, thereby completing the fabrication of the capacitor unit 142, wherein the third metal layer 134 composes the second electrode 140 of the capacitor unit 142, and the first metal layer 122 and the second metal layers 1281, 1282 and 1283 compose the first electrode 138 of the capacitor unit 142. Another difference between this embodiment and the first embodiment is that the second electrode 140 further includes an extending portion 1403 in this embodiment, wherein the extending portion 1403 has an "L" shape in its cross section. The extending portion 1403 extends outward in a direction parallel to the first protrudent portions 1382 and the surface of the substrate 100 and covers the outer sidewall of the outermost first protrudent portion 1382. Thus, a projection area A3 of the second electrode 140 on the surface of substrate 100 is greater than the projection area A1 of the first electrode 138 on the surface of substrate 100, and is greater than the projection area A2 (shown in FIG. 12) of the second electrode 140 on the surface of substrate 100 in the first embodiment. After that, the second insulating layer 144, the first contact holes 146, the second contact holes 148, the first contact elements 150 and the second contact element 152 may be formed through the methods similar to the first embodiment.

According to the present invention, the profile of the vertical (longitudinal) sectional view of the first electrode and the second electrode respectively have finger-shaped first protrudent portions and second protrudent portions, and a dielectric layer is disposed between them such that a contact surface between the first electrode and the dielectric layer and a contact area between the second electrode and the dielectric layer are both shown a "s" shape, thereby effectively increasing the capacitance because a vertical area is increased without increasing a horizontal area in the electrodes. Furthermore, in the second embodiment, a dielectric layer is disposed between the extending portion included in the second electrode and the outermost first protrudent portion, such that the capacitance may be further increased. Accordingly, under the conditions that the distance between the first conductive type transistor and the second conductive type transistor is fixed and the horizontal area of the capacitor is fixed, the present invention provides a SRAM structure with greater storage capacity and a related fabrication method with easier processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random-access memory (SRAM) structure, comprising:
    a substrate;
    a first conductive type transistor and a second conductive type transistor disposed on a surface of the substrate;
    an insulating layer disposed on the substrate, the insulating layer comprising a cavity located between the first conductive type transistor and the second conductive type transistor, wherein the cavity exposes a portion of the surface of the substrate with a source/drain of the first conductive type transistor and a source/drain of the second conductive type transistor; and
    a capacitor unit disposed in the cavity, the capacitor unit comprising:
        a first electrode, comprising a plurality of first protrudent portions and a first planar portion, wherein the first planar portion is directly formed on the exposed portion of the surface of the substrate, and the plurality of first protrudent portions are connected to the first planar portion in common and protrude away the surface of the substrate from the first planar portion;
        a second electrode, comprising a plurality of second protrudent portions and a second planar portion, wherein the second planar portion is disposed on the plurality of first protrudent portions, and the plurality of second protrudent portions are connected to the second planar portion in common and protrude toward the surface of the substrate from the second planar portion, wherein the plurality of first protrudent portions and the plurality of second protrudent portions are alternately arranged in parallel with each other; and
        a dielectric layer disposed between the second electrode and the first electrode.

2. The SRAM structure of claim 1, wherein the second electrode and the dielectric layer partially extend above a surface of the insulating layer.

3. The SRAM structure of claim 1, wherein the source/drain of the first conductive type transistor is a first doped region formed on the surface of the substrate, the source/drain of the second conductive type transistor is a second doped region formed on the surface of the substrate, and the first electrode is directly in contact with the first doped region and the second doped region.

4. The SRAM structure of claim 1, wherein in the capacitor unit, a projection area of the second electrode on the surface of the substrate is greater than a projection area of the first electrode on the surface of the substrate.

5. The SRAM structure of claim 1, wherein in the capacitor unit, a projection area of the dielectric layer on the surface of the substrate is greater than a projection area of the first electrode on the surface of the substrate.

6. The SRAM structure of claim 1, wherein the plurality of first protrudent portions form a plurality of geometric patterns having a common geometric center in a top view, and the plurality of geometric patterns are arranged from inward to outward respectively regarding the common geometric center as a central axis.

7. The SRAM structure of claim 6, wherein among the plurality of geometric patterns formed by the plurality of first protrudent portions, a portion of an outer sidewall of an outermost first protrudent portion is covered by the second electrode.

8. The SRAM structure of claim 1, wherein the first electrode and the second electrode comprise same conductive metal material, and the dielectric layer comprises high dielectric constant material.

9. A fabrication method of a SRAM structure, comprising:
providing a substrate with a first conductive type transistor, a second conductive type transistor and a first insulating layer disposed on a surface of the substrate, wherein the first insulating layer covers the first conductive type transistor and the second conductive type transistor;
forming a cavity in the first insulating layer, wherein the cavity is located between the first conductive type transistor and the second conductive type transistor, and the cavity expose a source/drain of the first conductive type transistor and a source/drain of the second conductive type transistor;
forming a first metal layer on the substrate, covering a top surface of the first insulating layer and a sidewall and a bottom surface of the cavity;
performing a step of removing a portion of the first metal layer located on the top surface of the first insulating layer;
performing a protrudent portion forming process by multiple times to form a plurality of first protrudent portions in the cavity and form a sacrificing layer between any adjacent two of the plurality of first protrudent portions, wherein the protrudent portion forming process comprises:
blanketly forming a sacrificing layer on the substrate such that the sacrificing layer covers the top surface of the first insulating layer and the sidewall and the bottom surface of the cavity;
performing a step of partially removing the sacrificing layer to remove a portion of the sacrificing layer that is located on the top surface of the first insulating layer and covers the bottom surface of the cavity;
blanketly forming a second metal layer on the substrate such that the second metal layer covers the surface of the first insulating layer and the remained portion of the sacrificing layer and the bottom surface of the cavity; and
performing a step of partially removing the second metal layer to remove a portion of the second metal layer that is located on the top surface of the first insulating layer and covers the bottom surface of the cavity, wherein after the step of partially removing the second metal layer, a portion of the second metal layer remained in the cavity is defined as a first protrudent portion;
after repeating the protrudent portion forming process by forming and partially removing sacrificing layers and metal layers, performing a step of removing the remained portions of sacrificing layer to form a plurality of recesses between the plurality of first protrudent portions;
blanketly forming a dielectric layer on the substrate to cover surfaces of the plurality of first protrudent portions and surfaces of the first insulating layer; and
blanketly forming a third metal layer on the substrate to fill the plurality of recesses and cover top surfaces of the plurality of first protrudent portions and a top surface of the dielectric layer; and
removing a portion of the third metal layer and a portion of the dielectric layer to expose at least a portion of the first conductive type transistor and at least a portion of the second conductive type transistor in a top view, wherein the first metal layer and the second metal layer remained on the substrate is defined as a first electrode, the third metal layer remained is defined as a second electrode, and the first electrode, the second electrode and the dielectric layer compose a capacitor unit.

10. The fabrication method of the SRAM structure of claim 9, further comprising:
forming a second insulating layer to cover the first insulating layer and the capacitor unit; and
forming two first contact elements and a second contact element in the first insulating layer and the second insulating layer, wherein the first contact elements penetrate through the second insulating layer and the first insulating layer and respectively contact another source/drain of the first conductive type transistor or another source/drain of the second conductive type transistor not exposed by the cavity, and the second contact element penetrates through the second insulating layer and contacts the second electrode.

11. The fabrication method of the SRAM structure of claim 9, wherein the step of removing a portion of the first metal layer located on the top surface of the first insulating layer comprises:
forming a planarization layer on the substrate, the planarization layer filling the cavity and covering the top surface of the first insulating layer;
performing an etching-back process or a polishing process to remove a portion of the planarization layer and a portion of the first metal layer located above the top surface of the first insulating layer; and
removing the planarization layer remained on the substrate.

12. The fabrication method of the SRAM structure of claim 9, wherein the step of blanketly removing the sacrificing layer comprises performing a wet etching process, and the wet etching process uses an etchant that has high etching selectivity to the sacrificing layer.

13. The fabrication method of the SRAM structure of claim 12, wherein a material of the sacrificing layer comprises tungsten, and materials of the first metal layer and the second metal layer comprise titanium nitride.

14. The fabrication method of the SRAM structure of claim 12, wherein the etchant comprises a solution of hydrogen peroxide and diluted sulfuric acid or hydrofluoric acid.

15. The fabrication method of the SRAM structure of claim 9, wherein the step of blanketly removing the sacrificing layer comprises performing a dry etching process, and the sacrificing layer comprise silicon nitride material.

16. The fabrication method of the SRAM structure of claim 15, wherein a portion of the first insulating layer is removed simultaneously when the sacrificing layer is blanketly removed, such that the plurality of first protrudent portions protrude from a surface of the first insulating layer remained on the substrate.

17. The fabrication method of the SRAM structure of claim 16, wherein the third metal layer and the dielectric layer remained on the substrate cover a portion of a sidewall of the first metal layer after removing the portion of the third metal layer and the portion of the dielectric layer.

\* \* \* \* \*